United States Patent [19]

Ariizumi

[11] Patent Number: 4,527,213
[45] Date of Patent: Jul. 2, 1985

[54] SEMICONDUCTOR INTEGRATED CIRCUIT DEVICE WITH CIRCUITS FOR PROTECTING AN INPUT SECTION AGAINST AN EXTERNAL SURGE

[75] Inventor: Shoji Ariizumi, Tokyo, Japan

[73] Assignee: Tokyo Shibaura Denki Kabushiki Kaisha, Kawasaki, Japan

[21] Appl. No.: 443,629

[22] Filed: Nov. 22, 1982

[30] Foreign Application Priority Data

Nov. 27, 1981 [JP] Japan .............................. 56-190124
Nov. 27, 1981 [JP] Japan .............................. 56-190125

[51] Int. Cl.³ .............................................. H02H 3/20
[52] U.S. Cl. ...................................... 361/56; 361/91; 361/111; 357/23
[58] Field of Search .................. 361/56, 91, 111, 110; 357/41, 13, 23, 48, 49 R, 23 GP

[56] References Cited

U.S. PATENT DOCUMENTS 3,403,270  9/1968  Pace et al. ..................... 361/91 X
3,819,952  6/1974  Enomoto et al. ................ 361/91 X

FOREIGN PATENT DOCUMENTS 159188  12/1979  Japan ............................. 357/23 GP

OTHER PUBLICATIONS

European Patent Application, published 7-7-82, Inventor—Shigenobu; Pub. No. 55,552.

Japanese Patent Disclosure (KOKAI) No. 54-116887, T. Tsujiide; Sep. 11, 1979.
Japanese Patent Disclosure (KOKAI) No. 53-18979, T. Wada; Feb. 21, 1978.

Primary Examiner—Patrick R. Salce
Attorney, Agent, or Firm—Finnegan, Henderson, Farabow, Garrett & Dunner

[57] ABSTRACT

A semiconductor integrated circuit device has circuits for protecting an input section against an external surge. The device comprises an input terminal, a first resistor connected at one end to the input terminal and a first protective circuit connected between the other end of the first resistor and a reference voltage source for accelerating the discharge of an input surge. The first protective circuit includes a first MOS transistor and a resistor element connected in series to the source-drain path of the first MOS transistor. The integrated circuit further comprises a second resistor connected at one end to the other end of the first resistor, a second protective circuit connected between the other end of the second resistor and the reference voltage source for lowering the potential at the node of the other end of the first resistor and one end of the second resistor, whenever the potential is abnormally high due to the input surge, and a second MOS transistor included in the input section. The gate of the second MOS transistor is connected to the other end of the second resistor for receiving an input signal from the input terminal through the first and second resistors.

6 Claims, 6 Drawing Figures

F I G. 1
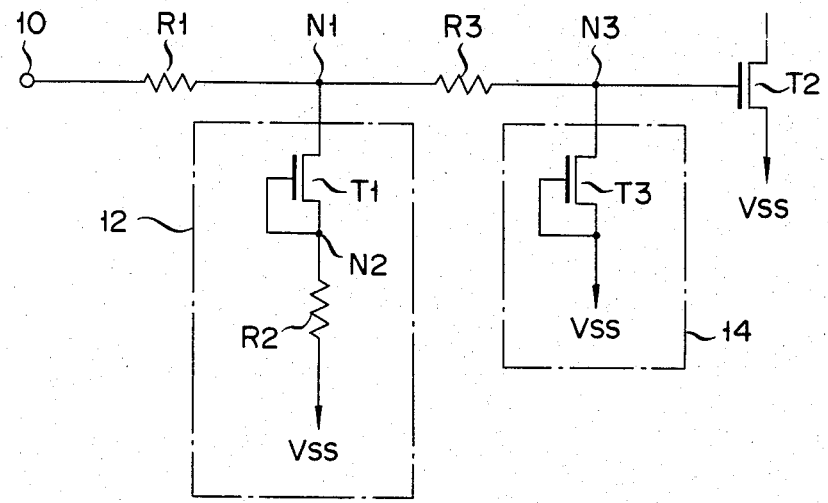
F I G. 2
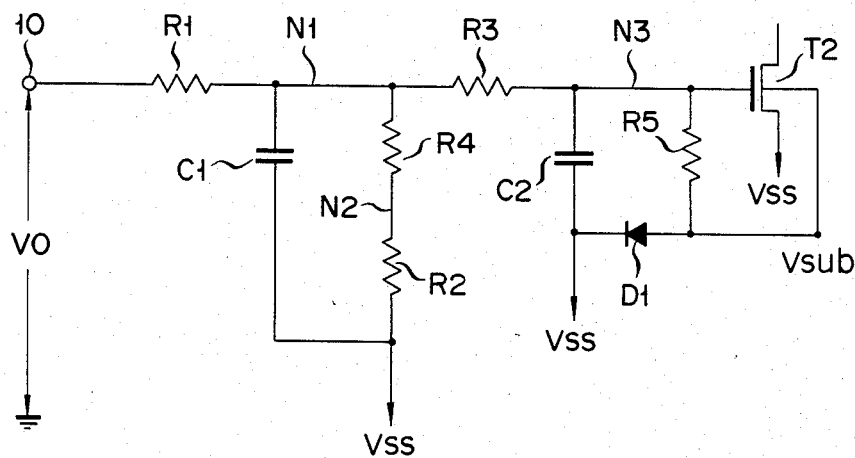

SEMICONDUCTOR INTEGRATED CIRCUIT DEVICE WITH CIRCUITS FOR PROTECTING AN INPUT SECTION AGAINST AN EXTERNAL SURGE

BACKGROUND OF THE INVENTION

This invention relates to a semiconductor integrated circuit device having circuits for protecting the input terminals of a MOS IC against an external electrostatic surge.

In recent years, the IC packing density of a semiconductor device has been increased. The gate oxide film of the device has been made thinner and thinner. Today semiconductor devices whose gate oxide films are 400 to 500 Å are commercially available. Such a thin gate oxide film may be broken if an electrostatic surge voltage is applied to it from a human body, for example. When the gate oxide film is broken, the MOS transistors will be short-circuited.

Measures against such a short-circuiting are disclosed in, for example, Japanese Patent Disclosure (Kokai) No. 54-116887. The semiconductor device shown in this publication includes a protective circuit for protecting an input MOS transistor against an external surge. The protective circuit is provided between an input terminal and the gate of the input MOS transistor. It comprises a first resistor connected at one end to the input terminal, a MOS transistor having its drain connected to the other end of the first resistor, and a second resistor connected between the source of the MOS transistor and a reference voltage source or a semiconductor substrate. The gate of the MOS transistor is connected to the reference voltage source or the semiconductor substrate. An external surge is discharged through the protective circuit, and the input MOS transistor is thus protected.

The drain potential of the MOS transistor of the protective circuit is equal to the input voltage divided by the sum of the resistances of the first and second resistors. Nonetheless, a considerably high voltage is still applied on the gate of the input MOS transistor.

SUMMARY OF THE INVENTION

It is an object of the present invention to provide a semiconductor integrated circuit device having an improved protective means for protecting the input section of the integrated circuit against an external surge applied to the input terminal of the integrated circuit.

According to the invention there is provided a semiconductor integrated circuit which comprises an input terminal; a first resistor connected at one end to the input terminal; a first protective circuit, connected between the other end of the first resistor and a reference voltage source, for accelerating discharge of an input surge, said first protective circuit including a first MOS transistor and resistor elements connected in series to the source-drain path of the first MOS transistor; a second resistor connected at one end to the other end of the first resistor; a second protective circuit, connected between the other end of the second 4 resistor and the reference voltage source, for lowering the potential at the node of the first and second resistors, said potential being abnormally high due to the input surge; and a second MOS transistor which is included in the input section of the semiconductor integrated circuit and whose gate is connected to the other end of the second resistor for receiving an input signal from the input terminal through the first and second resistors.

An input surge is discharged through the first protective circuit to the reference voltage source. Due to the resistor element of the first protective circuit, which is used to protect the first MOS transistor, the potential at the node of the first and second resistors is still too high. The charge at the node is discharged through the second protective circuit to the reference voltage source, nonetheless. Therefore, the input surge is not applied to the gate of the second MOS transistor. The gate oxide film of the second MOS transistor is fully protected from the input surge.

BRIEF DESCRIPTION OF THE DRAWINGS

Other objects and advantages of the invention will be apparent from the following description taken in conjunction with the accompanying drawings, in which:

FIG. 1 is a circuit diagram of a semiconductor integrated circuit according to the invention;

FIG. 2 is an equivalent circuit diagram of the circuit shown in FIG. 1;

DETAILED DESCRIPTION OF THE PREFERRED EMBODIMENTS

Figure 3:
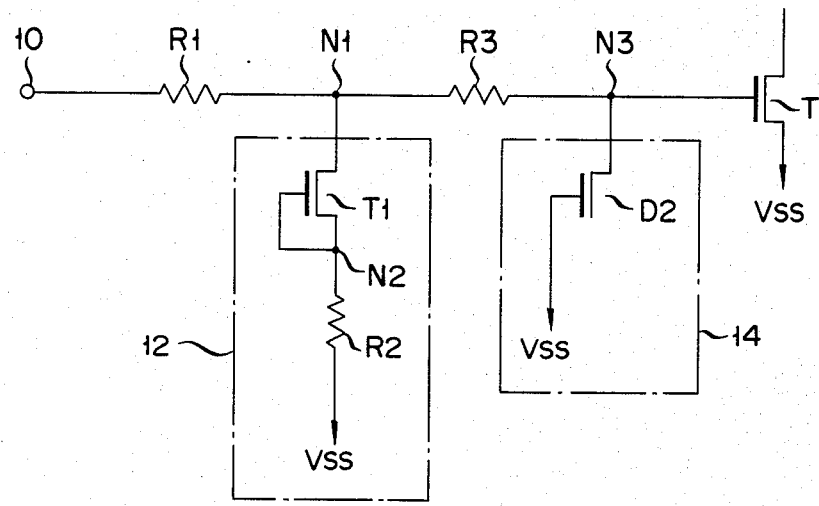
FIG. 3 is a circuit diagram of a modification of the circuit shown in FIG. 1.

FIG. 1 shows a semiconductor integrated circuit according to the present invention. As shown in FIG. 1, a protective resistor R1 of 500 to 1000 Ω made of a polycrystalline silicon is connected at one end to an input terminal or to an input pin 10. The other end of the protective resistor R1 is connected to one end of another protective resistor R3. The other end of the resistor R3 is connected to the gate electrode of an input MOS transistor T2. A first protective circuit 12 is connected between the node N1 of the protective resistors R1 and R3 and a reference voltage source $V_{SS}$.

The first protective circuit 12 includes a short-channel MOS transistor T1 having its drain connected to the node N1 and a resistor R2 connected between the source of the transistor T1 and the reference voltage source $V_{SS}$. The MOS transistor T1 is punched through when an external surge is applied to it. The gate of the MOS transistor T1 is connected to the node N2 of the transistor T1 and the resistor R2. The resistor R2 serves to limit the current flowing through the short-channel MOS transistor T1, and its resistance is from 50 Ω to several hundred ohms. The punch-through voltage of the MOS transistor T1 is lower than the surface breakdown voltage which the transistor T1 exhibits when it works as a long-channel MOS transistor. The surface breakdown voltage is determined by the thickness $t_{ox}$ of the gate oxide film of the transistor T1 and the diffusion depth $X_j$ of the source and drain of the transistor T1.

The protective resistor R3 has one end connected to the node N1 and the other end to the gate of the input MOS transistor T2 to be protected. A second protective circuit 14 is connected to the node N3 of the resistor R3 and the gate of the MOS transistor T2. The second protective circuit 14 includes a MOS transistor T3 whose drain is connected to the node N3 and whose gate and source are connected to the reference voltage source $V_{SS}$.

The resistor R1 and the stray capacitance C1 existing at the node N1 cooperate to lower the peak voltage of an input surge from the input pin 10. The peak voltage of the input surge is determined by time constant, $\tau$, which is given as: $\tau = C1 \cdot R1$. If the resistance of the resistor R1 is too high and if the resistor R1 is a diffusion layer, the pn junction will be broken. If the resistance of the resistor R1 is too high and the resistor R1 is a polycrystalline silicon layer, the layer will melt away. Moreover, if the resistance of the resistor R1 is too high, the time constant will increase and distort the input voltage waveform during the normal operation of the integrated circuit, and will eventually hinder the high speed operation of the integrated circuit. For this reason the resistor R1 should not have a relatively high resistance. It is desired that the resistance of the resistor R2 is determined to satisfy the relatin $R1/R2 \leq 3$.

FIG. 2 is an equivalent circuit diagram of the semiconductor integrated circuit shown in FIG. 1. The stray capacitance C1 is provided between the node N1 and the reference voltage source $V_{SS}$. The MOS transistor T1 has an equivalent resistor R4. Another stray capacitance C2 is provided between the node N3 and the reference voltage source $V_{SS}$. A diode D1 formed of a pn junction is provided between the substrate of the MOS transistors T2 and T3 and the reference voltage source $V_{SS}$. A spreading resistance R5 is provided by the surface breakdown of the MOS transistor T3. This resistance R5 is specific to the substrate.

In the circuit shown in FIGS. 1 and 2, the potential at the node N1 will rise when an input surge voltage $V_0$ is applied to the input pin 10. The short-channel transistor T1 will then be punched through, and the electric charge will be discharged from the node N2 through the resistor R2. The potential $V_1$ at the node N1 under this condition is given by:

$$V_1 \approx \frac{R2 + R4}{R1 + R2 + R4} \cdot V_0 \qquad (1)$$

Assuming that R4=0 and the punch-through voltage $V_{pt}$ of the MOS transistor T1 is applied on the transistor T1 during the punch-through period of the transistor T1, the potential $V_1$ is expressed as follows:

$$V_1 \approx \frac{R2}{R1 + R2} \cdot V_0 + V_{pt} \qquad (2)$$

$$\approx V_2 + V_{pt}$$

where $V_2$ is the potential at the node N2.

The voltage applied on the gate oxide film of the MOS transistor T1 is given as: $V_1 - V_2$. As evident from equation (2), this voltage is substantially equal to the punch-through voltage $V_{pt}$ of the MOS transistor T1. Therefore, the voltage applied on the gate oxide film of the MOS transistor T1 is extremely low. Hence, the gate oxide film of the transistor T1 can be prevented from being broken.

With the resistor R2, the potential at the node N1 would be higher than if without the resistor R2. The surge charge is further discharged through the resistor R3 to the reference voltage source $V_{SS}$ and the spreading resistance R5. The potential $V_3$ at the node N3 is given:

$$V_3 \approx \frac{R5}{R3 + R5} \cdot V_1 \qquad (3)$$

Assume that R1=630 $\Omega$, R2=70 $\Omega$, R3=400 $\Omega$, R5=200 $\Omega$, and $V_{pt}$ of transistor T1=15 V and that $V_0$ of 500 V is applied on the input pin 10. The potential $V_1$ is then:

$$V_1 \approx \frac{70}{630 + 70} \times 500 + 15 = 65 \text{ [V]}.$$

Then, from equation (3), the potential $V_3$ is:

$$V_3 \approx \frac{200}{400 + 200} \times 65 = 21.7 \text{ [V]}.$$

This means that only 21.7 V is applied on the gate of the MOS transistor T2.

A gate oxide film is usually broken when exposed to an electric field strength of 7 to 8 MV/cm. Since 21.7 V is applied on the gate of the MOS transistor T2, the thickness $t_{ox}$ of the gate oxide film can be reduced to 310 Å. That is:

$$t_{ox} = \frac{21.7}{7 \times 10^6} = 310 \text{ Å}.$$

The voltage applied on the gate oxide film of the MOS transistor T1 is the punch-through voltage of the transistor T1, i.e. 15 V. Hence, the thickness $t_{ox}$ of this gate oxide film can be reduced to 214 Å. That is:

$$t_{ox} = \frac{15}{7 \times 10^6} = 214 \text{ Å}.$$

The node 3 and the gate of the input MOS transistor T2 may be connected through a transmission transistor.

A modification of the circuit shown in FIG. 1 will be described with reference to FIG. 3. In this modification, a diode D2, not a MOS transistor T3, constitutes a second protective circuit 14. The diode D2 may be replaced by a short-channel MOS transistor which has the punch-through effect. In all other respects the circuit of FIG. 3 is identical with the circuit shown in FIG. 1. The same numerals are used to denote like or identical elements as shown in FIG. 1.

Figure 4:
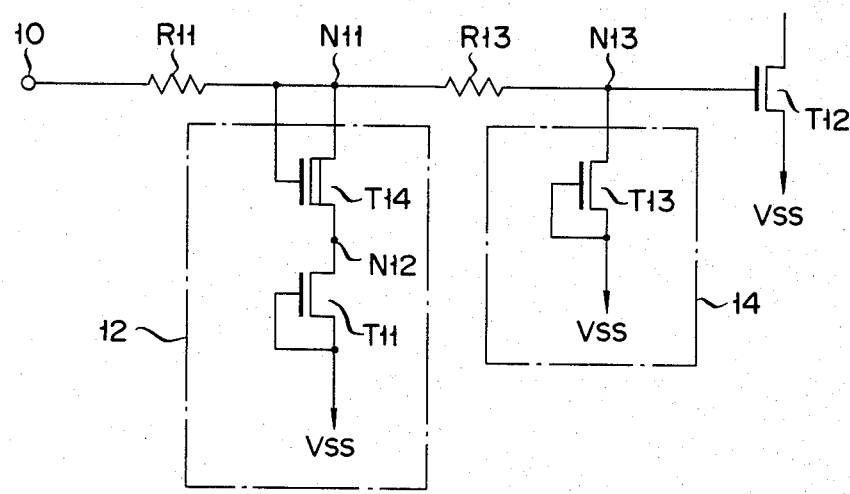
FIG. 4 is a circuit diagram of another semiconductor integrated circuit according to the invention.

Another semiconductor integrated circuit will be described with reference to FIG. 4. As shown in FIG. 4, a first protective resistor R11 of 500 to 1000 $\Omega$ made of a polycrystalline layer is connected at one end to an input terminal, or an input pin 10. The other end of the first protective resistor R11 is connected to one end of a second protective resistor R13. The other end of the second protective resistor R13 is connected to the gate of an input MOS transistor T12. A first protective circuit 12 is connected between the node N11 of the resistors R11 and R13 and a reference voltage source $V_{SS}$.

The first protective circuit 12 includes a MOS transistor T11 for discharging a surge charge and a depletion MOS transistor T14 for protecting the MOS transistor T11. The source-drain paths of these MOS transistors T11 and T14 are connected in series between the node N11 and the reference voltage source $V_{SS}$. More specifically, the gate of the MOS transistor T14 is connected to the node N11, and the gate of the MOS transistor T11 is connected to the reference voltage source $V_{SS}$.

Between the node N13 of the resistor R13 and the transistor T12 and the reference voltage source $V_{SS}$ there is connected a second protective circuit 14. The second protective circuit 14 includes a MOS transistor T13 for discharging a surge charge inorder to protect the input MOS transistor T12. The gate of the MOS transistor T13 is connected to the reference voltage source $V_{SS}$. The drain of the MOS transistor T13 is connected to the node N13.

Figure 5:
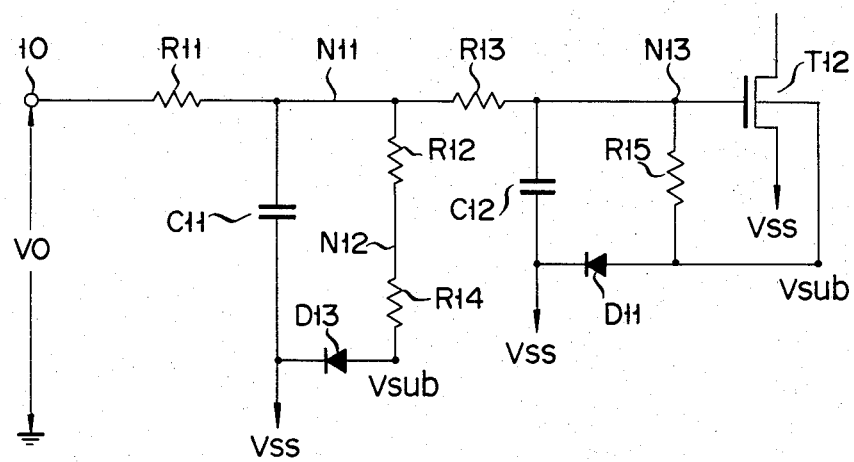
FIG. 5 is an equivalent circuit diagram of the circuit shown in FIG. 4.

FIG. 5 is an equivalent circuit diagram of the semiconductor integrated circuit shown in FIG. 4. A stray capacitance C11 is provided between the node N11 and the reference voltage source $V_{SS}$. A diode D13 is formed of a pn junction and provided between the substrate of the MOS transistor T11 and the reference voltage source $V_{SS}$. A spreading resistance R14 is provided by the surface breakdown of the MOS transistor T11. The resistance R14 is specific to the substrate of the transistor T11. Another stray capacitance C12 is provided between the node N13 of the resistor R13 and the transistor T12 on one hand and the reference voltage source $V_{SS}$ on the other. Another diode D11 is formed between the substrate of the MOS transistors T12 and T13 and the reference voltage source $V_{SS}$. Further, a spreading resistance R15 is provided by the surface breakdown of the MOS transistor T13, which is specific to the substrate of the MOS transistor T13.

The potential $V_{11}$ at the node N11, the potential $V_{12}$ at the node N12 of the MOS transistors T11 and T14, and the voltage $V_{21}$ between the nodes N11 and N12 are given as follows if an external surge $V_0$ is applied to the input pin 10:

$$V_{11} \approx \frac{R12 + R14}{R11 + R12 + R14} \cdot V_0 \quad (4)$$

$$V_{12} \approx \frac{R14}{R12 + R14} \cdot V_{11} \quad (5)$$

$$V_{21} \approx \frac{R12}{R12 + R14} \cdot V_{11} \quad (6)$$

As understood from equation (5), the potential $V_{12}$ is obtained by dividing the potential $V_{11}$ by the resistors R12 and R14. The voltage applied on the gate oxide film of the MOS transistor T11 is lower than if the MOS transistor T14 were not provided. The resistance of the resistor R12 is low, the MOS transistor T14 is on all the time the integrated circuit is powered, and the drain and gate of the MOS transistor T14 are at the same potential. Therefore, the voltage applied on the gate oxide film of the MOS transistor T14 is extremely low as evident from equation (6). As a result, the input pin 10 can withstand a relatively high input surge voltage. The gate oxide films of the MOS transistor T11 and T14 are not broken although they are relatively thin.

Without the depletion MOS transistor T14, the potential at the node N11 could be lower. Nonetheless, a surge charge is discharged to the reference voltage source $V_{SS}$ through the resistor R13 and the spreading resistance R15. No high voltage is applied on the gate of the input MOS transistor T12 for the reason stated above in connection with the circuit of FIG. 1. The gate oxide film of the input MOS transistor T12 is prevented from being broken.

Figure 6:
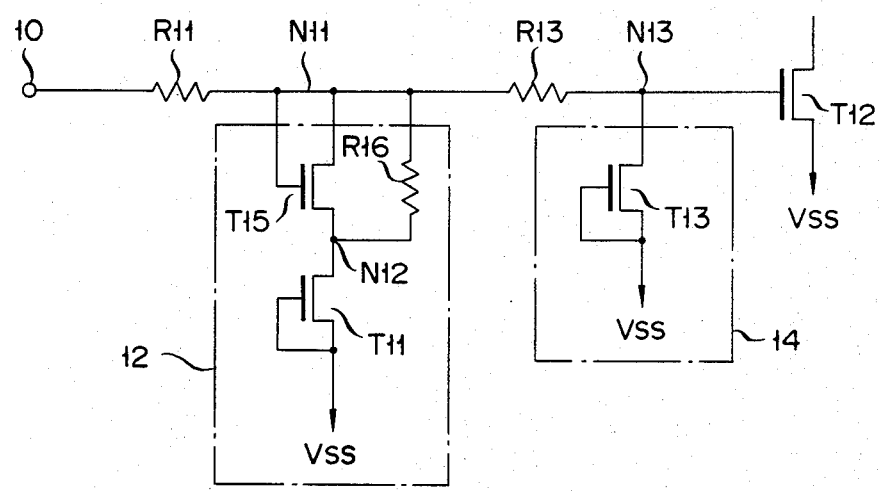
FIG. 6 is a circuit diagram of a modification of the circuit shown in FIG. 4.

A modification of the circuit shown in FIG. 4 will be described with reference to FIG. 6. In this modification an enhancement MOS transistor T15 and a resistor R16 are used in a first protective circuit in place of a depletion MOS transistor. The resistor R16 is connected in parallel to the source-drain path of the MOS transistor T15. It has a resistance similar to the on-resistance of a depletion MOS transistor T14 used in the circuit of FIG. 4. It can therefore prevent the node N12 of the transistor T15 and a MOS transistor T11 from entering into a floating state. A MOS transistor T13 constituting a second protective circuit 14 may be replaced by a gate controlled diode as in the circuit of FIG. 3. In all other respects the circuit of FIG. 6 is identical with the circuit shown in FIG. 4. The same numerals are used to designate like or the same elements as shown in FIG. 4.

What is claimed is:

1. A semiconductor integrated circuit device comprising:
   an input terminal;
   a reference voltage source;
   a first resistor means having first and second ends and connected at said first end of said first resistor means to said input terminal to which an input surge is supplied;
   a first protective means connected between said second end of said first resistor means and said reference voltage source for accelerating discharge of an input surge, said first protective circuit including a first short channel MOS transistor which is punched through by the input surge and a resistor element connected in series to the source-drain path of said first MOS transistor which has a gate connected to the source thereof;
   a second resistor means having first and second ends and connected at said first end of said second resistor means to said second end of said first resistor means;
   a second protective means connected between said second end of said second resistor means and said reference voltage source for lowering the potential at a junction of said second resistor means and said second protection means, whenever said potential is abnormally high due to the input surge;
   a second MOS transistor which is included in the input section of the semiconductor integrated circuit and whose gate is connected to said second end of said second resistor means through a connecting means for receiving an input signal from the input terminal through said first and second resistor means; and
   said second protective means comprising a third MOS transistor, the gate thereof being connected to said reference voltage source.

2. A semiconductor integrated circuit device according to claim 1, wherein said resistor element is a depletion MOS transistor, the gate thereof being connected to a junction of said second end of said first resistor means and said first end of said second resistor means, and the source-drain path thereof being connected to said junction of said first and second resistor means and to one end of the source-drain path of said first MOS transistor, and the other end of the source-drain path and the gate of said first MOS transistor being connected to said reference voltage source.

3. A semiconductor integrated circuit device according to claim 1, wherein said resistor element includes an enhancement MOS transistor whose gate is connected to a junction of said second end of said first resistor means and said first end of said second resistor means and whose source-drain path is connected to one end of the source-drain path of said first MOS transistor and a resistor which is connected in parallel to the source-drain path of said enhancement MOS transistor, and the gate of said first MOS transistor and the other end of the source-drain path of said first MOS transistor are connected to said reference voltage source.

4. A semiconductor integrated circuit device comprising:

an input terminal;

a reference voltage source;

a first resistor means having first and second ends and connected at said first end of said first resistor means to said input terminal to which an input surge is supplied;

a first protective means connected between said second end of said first resistor means and said reference voltage source for accelerating discharge of an input surge, said first protective circuit including a first short channel MOS transistor which is punched through by the input surge and a resistor element connected in series to the source-drain path of said first MOS transistor which has a gate connected to the source thereof;

a second resistor means having first and second ends and connected at said first end of said second resistor means to said second end of said first resistor means;

a second protective means connected between said second end of said second resistor means and said reference voltage source for lowering the potential at a junction of said second resistor means and said second protection means, whenever said potential is abnormally high due to the input surge;

a second MOS transistor which is included in the input section of the semiconductor integrated circuit and whose gate is connected to said second end of said second resistor means through a connecting means for receiving an input signal from the input terminal through said first and second resistor means; and said second protective means comprising a gate controlled diode of MOS type, the gate thereof being connected to said reference voltage source.

5. A semiconductor integrated circuit device according to claim 4, wherein said resistor element is a depletion MOS transistor, the gate thereof being connected to a junction of said second end of said first resistor means and said first end of said second resistor means, and the source-drain path thereof being connected to said junction of said first and second resistor means and to one end of the source-drain path of said first MOS transistor, and the other end of the source-drain path and the gate of said first MOS transistor are connected to said reference voltage source.

6. A semiconductor integrated circuit device according to claim 4, wherein said resistor element includes an enhancement MOS transistor whose gate is connected to a junction of said second end of said first resistor means and said first end of said second resistor means and whose source-drain path is connected to one end of the source-drain path of said first MOS transistor and a resistor which is connected in parallel to the source-drain path of said enhancement MOS transistor, and the gate of said first MOS transistor and the other end of the source-drain path of said first MOS transistor are connected to said reference voltage source.

\* \* \* \* \*